(12) United States Patent
Duncan et al.

(10) Patent No.: US 7,763,949 B2
(45) Date of Patent: Jul. 27, 2010

(54) MEMS DEVICE WITH CONTROLLED GAS SPACE CHEMISTRY

(75) Inventors: Walter M. Duncan, Dallas, TX (US);
Simon Joshua Jacobs, Lucas, TX (US);
Michael R. Douglass, Plano, TX (US);
Richard O. Gale, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1613 days.

(21) Appl. No.: 10/833,527

(22) Filed: Apr. 28, 2004

(65) Prior Publication Data

US 2010/0165314 A1 Jul. 1, 2010

Related U.S. Application Data

(62) Division of application No. 10/101,669, filed on Mar. 18, 2002, now Pat. No. 6,746,886.

(60) Provisional application No. 60/277,060, filed on Mar. 19, 2001.

(51) Int. Cl.
*H01L 21/56* (2006.01)

(52) U.S. Cl. ............... 257/434; 257/98; 257/E29.324; 438/48

(58) Field of Classification Search ............... 257/98, 257/434; 438/48
See application file for complete search history.

(56) References Cited

U.S. PATENT DOCUMENTS

| 5,936,758 | A | 8/1999 | Fisher et al. | |
| 6,624,944 | B1 | 9/2003 | Wallace et al. | |
| 6,746,886 | B2 | 6/2004 | Duncan | |
| 6,827,449 | B1 * | 12/2004 | Klonis et al. | 353/31 |
| 2002/0114058 | A1 * | 8/2002 | DeReus et al. | 359/298 |
| 2002/0181838 | A1 * | 12/2002 | Cunningham et al. | 385/16 |
| 2003/0057574 | A1 | 3/2003 | Boroson et al. | |
| 2006/0063351 | A1 * | 3/2006 | Jain | 438/455 |
| 2006/0088980 | A1 * | 4/2006 | Chen et al. | 438/460 |

* cited by examiner

*Primary Examiner*—A. Sefer
(74) *Attorney, Agent, or Firm*—Charles A. Brill; Wade James Brady, III; Frederick J. Telecky, Jr.

(57) ABSTRACT

A process for protecting a MEMS device used in a UV illuminated application from damage due to a photochemical activation between the UV flux and package gas constituents, formed from the out-gassing of various lubricants and passivants put in the device package to prevent sticking of the MEMS device's moving parts. This process coats the exposed surfaces of the MEMS device and package's optical window surfaces with a metal-halide film to eliminate this photochemical activation and therefore significantly extend the reliability and lifetime of the MEMS device.

10 Claims, 4 Drawing Sheets

MEMS DEVICE WITH CONTROLLED GAS SPACE CHEMISTRY

This application is a Divisional of application Ser. No. 10/101,669, filed Mar. 18, 2002 now U.S. Pat. No. 6,746,886 which claims priority under 35 USC §119(e)(1) of Provisional Application No. 60/277,060, filed Mar. 19, 2001.

FIELD OF THE INVENTION

The present invention relates to micro electro-mechanical systems (MEMS) devices and more specifically to enhancing the reliability and lifetime of these devices when operating in the presence of UV illumination.

BACKGROUND OF THE INVENTION

Micro electro-mechanical system (MEMS) devices are usually small structures, which rely on mechanical motion to function. The digital micro-mirror device (DMD) is a MEMS structure comprised of an array of tiny micro-mirrors, which are attached to costs extended up from the substrate by means of compliant torsion hinges. Electrostatic fields between the mirrors and memory located in the underlying semiconductor substrate cause the mirrors to rotate (tilt) in either a positive or negative direction. These devices have found wide application as spatial light modulators (SLM) and optical switching devices.

Since there is motion involved, special lubricants, passivants, getters, and/or other gases are often included in the package headspace (space inside package around device) around the device to assure smooth (proper) operation of the device. For example, without special lubricants the micromirrors of a DMD may stick causing a lubricants the micromirrors of a DMD may stick causing a defect in the device. This sticking problem can result from hydration, surface tension, tribology, or any number of other effects for which these special lubricants and getters help prevent.

There are a number of applications requiring UV illumination, such as photolithography and photo-finishing, where MEMS devices are highly effective, due to their optical performance. However, the headspace chemistry inside the MEMS package often contains sufficient amounts of fluorocarbon, chlorocarbon, fluorochlorocarbon, and hydrofluorochlorocarbon modalities that when exposed to UV flux can become reactive, due to photochemical activation, damaging the surfaces of the MEMS device and the package optical window.

What is needed is a way to eliminate this surface degradation in MEMS devices, caused by photochemical activation, when used in UV illuminated applications. This invention describes a new use process for enhancing the reliability, and hence the lifetime of MEMS devices in UV exposed environments by properly coating the device and window surfaces with a metal halide.

SUMMARY OF THE INVENTION

This invention discloses a process for precluding damage to a MEMS device, used in a UV illuminated application, due to a photochemical activation between the optical UV flux and package gas constituents. These cases come from outgassing of various lubricants and passivants put in the device package to prevent sticking of the MEMS device's moving parts. When these gases are exposed to UV flux, various chemical radicals can be generated that can etch or otherwise damage the surfaces of the device and the package window.

The essence of this invention is to coat the exposed surfaces of the MEMS device and window surface with various metal-halides to eliminate this photochemical activation and therefore significantly extend the reliability and lifetime of the MEMS device. These coating prevent the Si and $SiO_2$ of the MEMS device, and the $SiBO_7$ of the package's optical window from being exposed to UV flux, thereby eliminating the formation of such volatile compounds as $SiF_4$, $SiCl_4$, $BF_3$, and $BCl_3$, any of which has the tendency destroy the MEMS device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
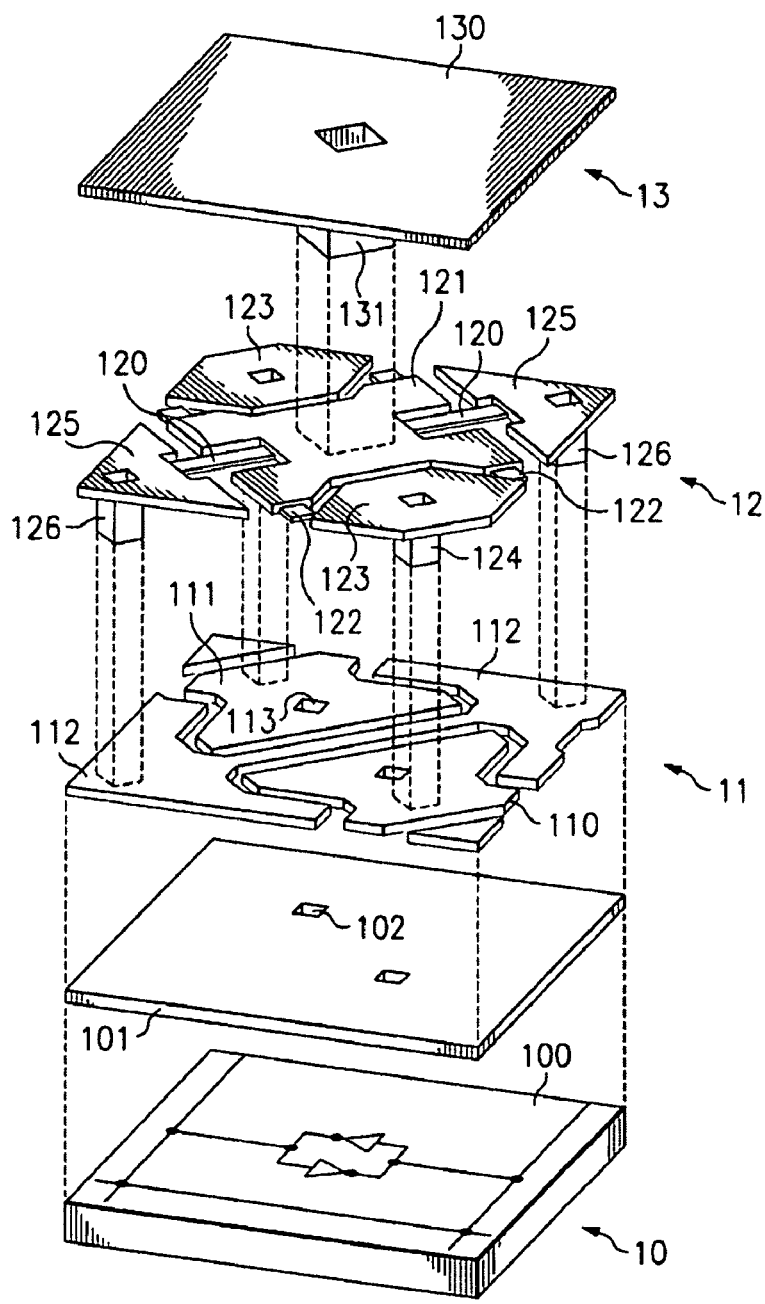
FIG. 1 is an exploded view of a DMD, which is a MEMS device, showing the micro-mechanical moving parts.

This invention discloses a process for protecting a MEMS device, used in a UV illuminated application, from damage due to a photochemical activation between the UV flux and gas constituents inside the package. One popular type of MEMS device is the digital micro-mirror device (DMD), which consists of an array of micro-mirrors, attached to posts extended above the substrate by means of compliant torsion hinges. FIG. 1 is an exploded view showing the four layers of a DMD device; which are (1) a memory substrate level 10, (2) an address electrode and landing pad level 11, (3) a yoke/hinge level 12, and (4) a reflective mirror level 13.

The substrate layer 10, consists of an orthogonal array of CMOS memory address circuits 100 covered by an insulating thick silicon oxide ($SiO_2$) layer 101. The micro-mirror superstructure is fabricated over this memory array and connected to the address electrodes of the memory array through vias 102.

A metal-3 address electrode/landing pad level 11, which includes Aluminum yoke address electrodes 110, 111 and landing pads 112 are then fabricated on top of the thick oxide layer 101. The address electrodes 110, 111 connect to the respective binary outputs of the CMOS address circuits 100 through the vias 113 and vias 102 in the thick oxide layer Next, a yoke/hinge level 12 consisting of a yoke 121 and torsion hinge 120 structure, mirror address electrodes 123, and hinge posts 126 and post caps 125 is built over the address electrode/landing pad level. The yoke 121, which supports the mirror assembly 130 on the top level 13, is suspended in air above the metal-3 layer 11 and rotates about a diagonal axis, on the torsion hinges 120, until the yoke landing tips 122 contact the landing pads 112 below. It is seen that the geometry of the yoke 121 and the spacing between the metal-3 level 11 and the yoke/hinge level 12 determines the tilt angle of the yoke/mirror structure. The hinge posts 126 sit on top of and in contact with the metal landing pads 112 at the metal-3 level 11, so that the yoke and landing pads are at the same electrical potential. The mirror address pads 123 are attached to the yoke addressing pads 110 by additional posts 124. In this case, a voltage potential difference is applied between the mirror address electrodes 123 and the mirror 130 above the pad at level 13, which sets up an electrostatic force that assists in causing the yoke/mirror structure to rotate on the torsion hinges 120.

The top level 13 consists of the highly reflective Aluminum mirror 130 and mirror post 131, which ride on top of the yoke 121, tilting typically +/−10°.

In operation, electrostatic forces cause the mirror/yoke structure to rotate on its torsion axis, defined along the torsion hinges. These electrostatic forces are established by the voltage potential difference between the yoke address electrode 110/111 and the yoke 121 and between the mirror address electrode 123 and the mirror 130, respectively. The yoke/mirror structure is mechanically limited in its rotation when the yoke tips 122 lands on the landing pads 112.

In the case of DMD MEMS device, it is at this point of contact, where the mirror landing tips 122 come in contact with the landing pads 112, that sticking can occur causing a device defect. To prevent this sticking between the moving mirror structure and the static landing pads, passivants and moisture gathering getters are often added to the DMD package. The getters collect any moisture in the environment, which has a tendency to cause the mechanical parts to stick together. The passivants lubricate the parts to help prevent any sticking from occurring.

Figure 2:
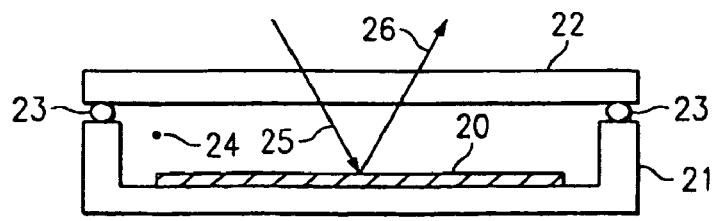
FIG. 2 is a cross sectional view of a DMD package showing the mounted device, optical window, and the incoming and reflected optical flux associated with the device.

FIG. 2 is a cross-sectional drawing of a typical DMD package. This includes the DMD device 20 mounted in the package body 21 with an optical window 22 sealed to the package by means of an O-ring 23. The getters and passivants are included inside the closed package. Due to out-gassing and such, there is any number of gas constituents present in the headspace 24 inside the package and around the surface of the DMD. Typically in a DMD, illumination flux enters the DMD along a first light path at an off-axis angle through the package cover glass 22. This light is then modulated by means of the DMD and then the light 26 is reflected out of the package along a second light path. For visible light this has proven to be a reliable structure, which provides long lifetime devices. Usually, the optically clear borosilicate glass window is coated with an AR (anti-reflective) coating to prevent reflections from occurring and therefore to give higher optical performance. However, for UV illuminated applications there can be a photochemical activation between the UV flux and the package headspace gas chemistries (chemistries for surface electrostatic and stiction problems resulting from hydration, surface tension, tribology, and any number of other effects) that become reactive, generating volatile radicals that are damaging to the surface of the MEMS device and the inside surface of the borosilicate glass window.

Existing metal-halide coatings in the anti-reflective coatings applied to the inner surface of the package window were found to protect the anti-reflective coating. The present invention takes advantage of the protection provided by the metal halide coatings to avoid degradation from headspace chemical components under the influence of UV optical flux.

Figure 3A:
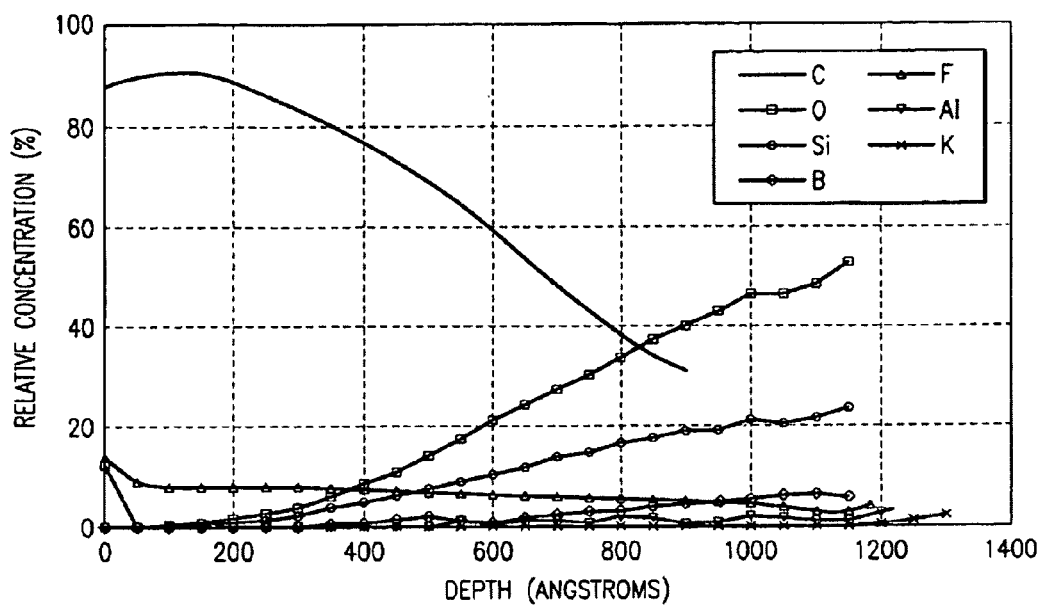
FIG. 3a is a graph showing the large concentrations of various gas constituents that are generated when unprotected surfaces of a MEMS device and package are exposed to UV flux.

FIG. 3a is a graph of X-ray Photoemission Spectroscopy (XPS) data showing what happens when an unprotected MEMS device is exposed to UV flux. This graph gives relative concentration levels vs. depth profile, showing high concentration level of some elements. Elements observed include carbon (C), oxygen (O), silicon (Si), boron (B), fluorine (F), aluminum (Al), potassium (K), and nitrogen (N). For example, the percent concentration of these elements at 100 and 1000-Angstrom depths are as show in Table 1.

TABLE 1

| Elements | Al | B | C | F | K | N | O | Si | Total |
|---|---|---|---|---|---|---|---|---|---|
| 100⊕ | 0 | 0.1 | 91.3 | 8.1 | 0 | 0 | 0.5 | 0 | 100 |
| 1000⊕ | 2.2 | 5.4 | 20.3 | 4.3 | 0 | 0 | 46.5 | 21.2 | 99.9 |

Note that this data indicates a large concentration of carbon (C) on the surface of the window and device.

Figure 3B:
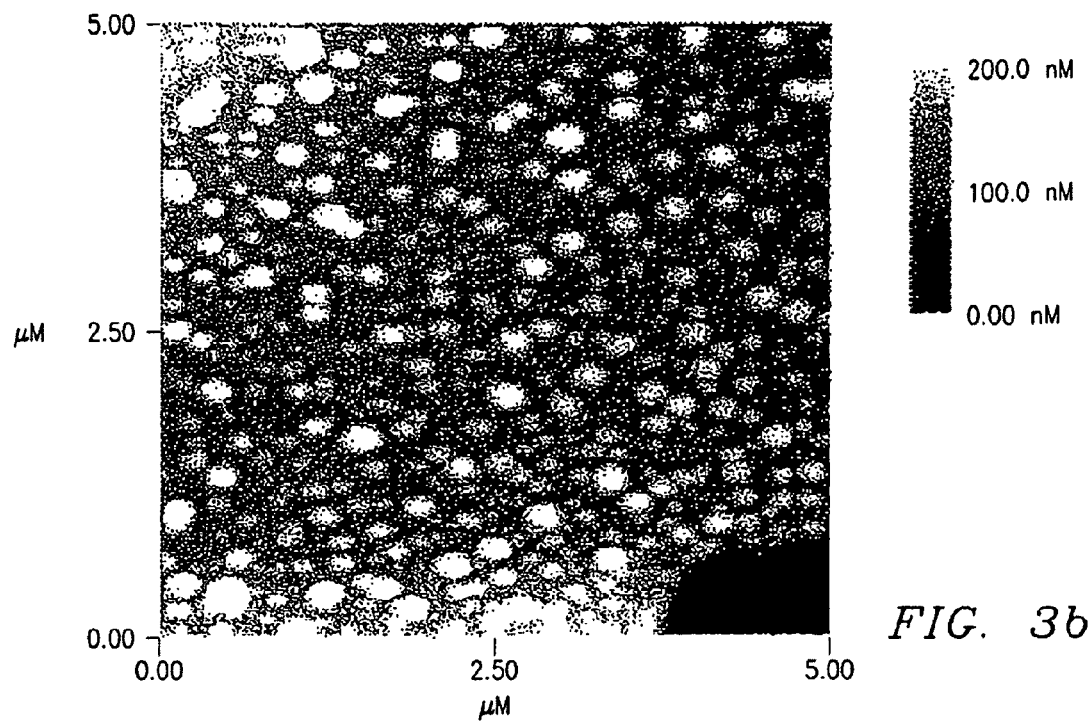
FIG. 3b is a photograph illustrating the damage that can be caused to the unprotected surfaces of MEMS devices and/or package window by volatile compounds generated when UV flux interacts with the gases located in the headspace of the MEMS package.

FIG. 3b is a photograph showing the effect of exposing the headspace gas constituents to UV flux. Both the MEMS device surfaces and the inside borosilicate glass window surface are observed to accumulate nodule like features 30, an extremely undesirable condition for a MEMS device such as the DMD.

Figure 4A:
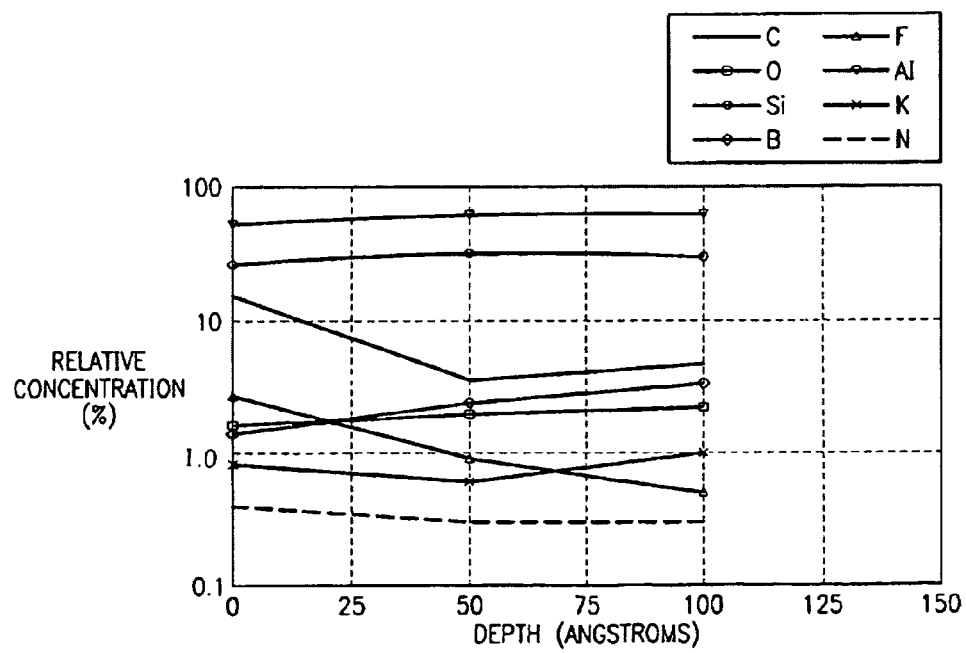
FIG. 4a a graph showing the relatively low concentrations of various gas constituents in areas of a MEMS package that have not been exposed to UV flux.
Figure 4B:
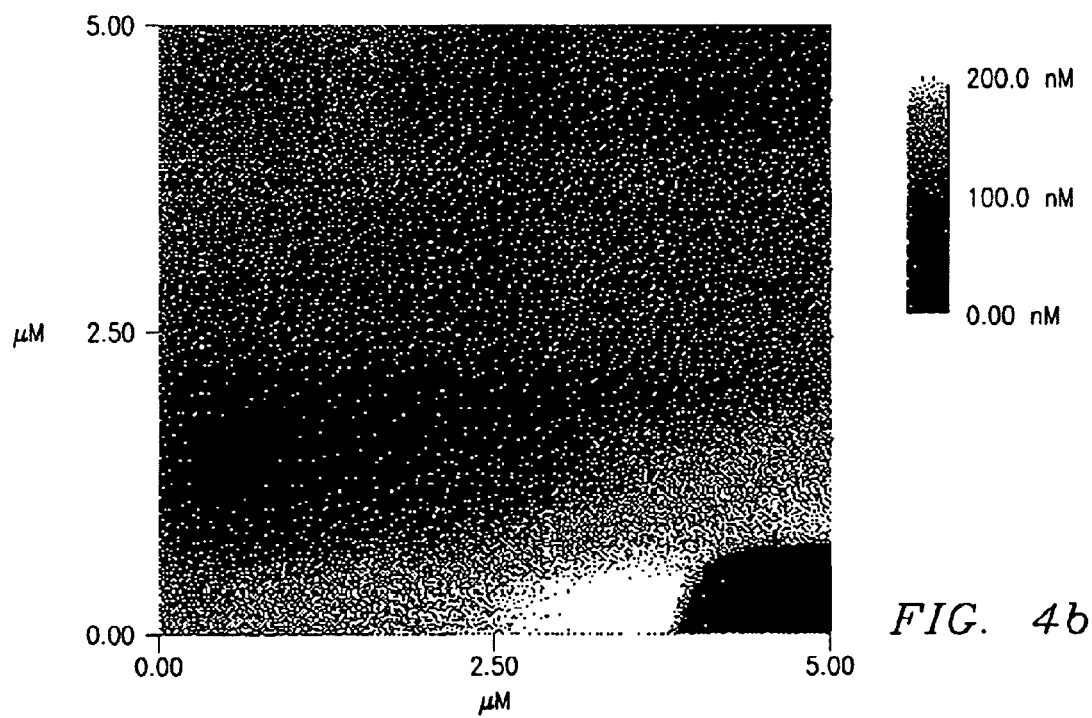
FIG. 4b is a photograph illustrating the undamaged surface of MEMS devices that have not been exposed to UV flux.

However, back in the remote areas of the MEMS device where the UV flux can't reach (unilluminated areas), these nodules are not observed. The photograph of FIG. 4b shows surfaces of the MEMS device in these unilluminated areas of the package without any nodules. FIG. 4a is a graph of X-ray Photoemission Spectroscopy (XPS) data showing concentration levels for an unprotected MEMS device in the areas of the package that are not exposed to UV flux. This graph gives relative concentration levels vs. depth profile for 0, 50, and 100 Angstroms depth. As for the above UV exposed case of FIG. 3a, the elements observed include carbon (C), oxygen (O), silicon (Si), boron (B), fluorine (F), aluminum (Al), potassium (K), nitrogen (N).

The XPS data for the relative concentration levels for the same elements at 100 Angstroms depth are shown in Table 2. Note that these values are relative percentages and cannot be compared directly with those of Table 1.

TABLE 2

| Elements | Al | B | C | F | K | N | O | Si | Total |
|---|---|---|---|---|---|---|---|---|---|
| 100⊕ | 2.2 | 3.2 | 4.5 | 0.5 | 1.0 | 0.3 | 59.6 | 28.8 | 100.1 |

In these areas of the MEMS package where the UV radiation does not reach, there is a much lower concentration of carbon (C).

As can be seen in the above data, many of the passivants, lubricants, and other gas constituents used in MEMS devices contain fluorocarbon, chlorocarbon, fluorochlorocarbon, and hydrofluorochlorocarbon modalities. Hydrofluorochlorocarbon compounds, for example, are of the form $U_v C_w Cl_x F_y H_z$, where U is any element or modality and C is carbon, Cl is chlorine, F is fluorine, H is hydrogen and v, w, x, y, and z subscripts represent the relative amount of the respective elements in the compound.

In the presence of incoming UV flux, compounds of the type $U_v C_w Cl_x F_y H_z$ may fragment to form Cl*, F*, CCl*, CF*, CFCl*, HCCl*, and HCF* radicals, which are reactive intermediate compounds. These are given by the equations below, where the radical species are designated by an asterisk and optical flux by $h_v$:

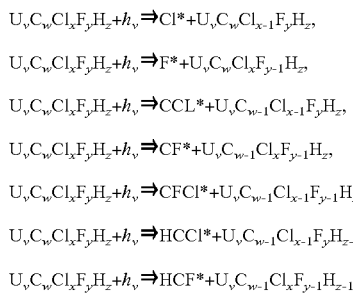

These radicals are potentially reactive to Si, $SiO_2$, $SiB_2O$—, which are primary exposed surfaces in a MEMS device.

Statistically these radicals can encounter the remainder of the original molecule and relax to reform the starting compounds or they can react with Si, $SiO_2$, $SiB_2O_7$. If the radicals react with Si, $SiO_2$, $SiB_2O_7$, volatile compounds such as $SiF_4$, $SiCl_4$, $BF_3$, and $BCl_3$ may form and transport material from the illuminated areas to other unilluminated areas of the device package. Kinetic, mass transport and mass action factors, depending on concentration levels of reactants, limit decomposition and material loss. Examples of decomposition reactions resulting in transport of Si, $SiO_2$, $SiB_2O_7$ are:

$Si(s) + 4CF^* + 2O2 = SiF4(g) + 4CO(g)$, and $SiO2(s) + 4CF^* + O2 = SiF4(g) + 4CO(g)$.

Hence, under UV optical irradiation and the presence of $U_v C_w Cl_x F_y H_z$ compounds, exposed Si, $SiO_2$, $SiB_2O_7$ surfaces may be etched (severely damaged).

However, when the surfaces of the MEMS device and/or borosilicate optical window are coated with a thick or thin metal-halide film, both the device and window remain free of the nodule like feature after irradiation. Table 3 compares the XPS data for the relative concentration levels of a MEMS device that is coated with $MgF_2$ (magnesium fluoride), in both the illuminated and unilluminated areas of the package.

TABLE 3

| Elements | Al | B | C | F | K | Mg | N | O | Si | Total |
|---|---|---|---|---|---|---|---|---|---|---|
| UV Illuminated Areas - 0⊕ | 0.1 | 0 | 57.0 | 30.1 | 0 | 11.9 | 0 | 1.0 | 0 | 100 |
| Unilluminated Areas - 0⊕ | 0.3 | 0 | 60.1 | 27.0 | 0 | 11.5 | 0 | 1.1 | 0 | 100 |

Again, these numbers represent percent concentrations of the various elements rather than actual amounts. It is seen that the values in UV illuminated areas of the package are the same as for the unilluminated areas, within the measurement capability.

Figure 5:
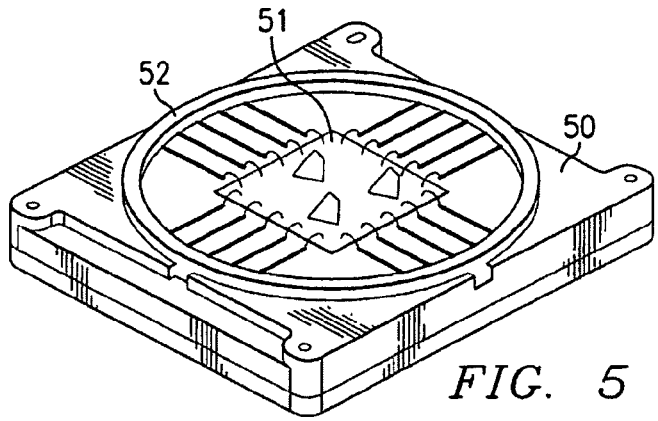
FIG. 5 is drawing of a DMD package where the device and window surface are coated with a metal-halide film to protect the device from damage due to UV photochemical activation.

FIG. 5 is a drawing of a MEMS package 50 showing a DMD 51 mounted with its leads bonded (connected) to pins coming out of the package. An optical clear borosilicate glass window 52 is shown mounted to the device. In the present invention, the inside surface of the glass window 52 and/or the exposed surfaces of the DMD are coated with a metal-halide film; e.g., $MgF_2$, to prevent photochemical activation from occurring when the device is exposed to UV illumination.

Figure 6A:
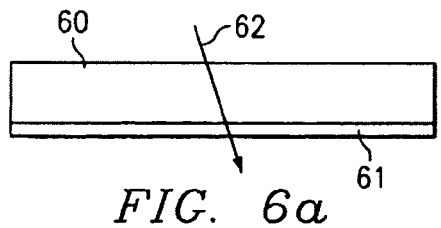
FIG. 6a is a drawing showing an optical window of a DMD, which has been coated with a metal-halide thin film (single layer) to prevent the photochemical activation from occurring when the device is illuminated with UV flux.
Figure 6B:
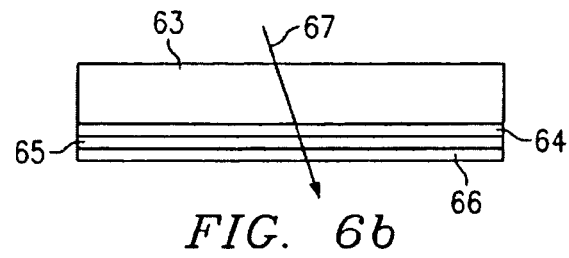
FIG. 6b is a drawing showing an optical window of a DMD that has been coated with a metal-halide thick film (three layers) to prevent the photochemical activation from occurring when the device is illuminated with UV flux.

FIG. 6a is a sketch showing a clear borosilicate glass window 60 with a thin metal-halide film 61, such as $MgF_2$ deposited on the underside (exposed surface inside package) of the window. The off-axis UV illumination 62 is shown passing through this single layer thin metal-halide film 61. Similarly, FIG. 6b is a sketch showing a borosilicate glass window 63 with a thick, multilayer metal-halide film 64-66, such as $MgF_2$ deposited on the underside of the window. The off-axis UV illumination 67 is shown passing through this multilayer thick metal-halide film 64-66.

Figure 7:
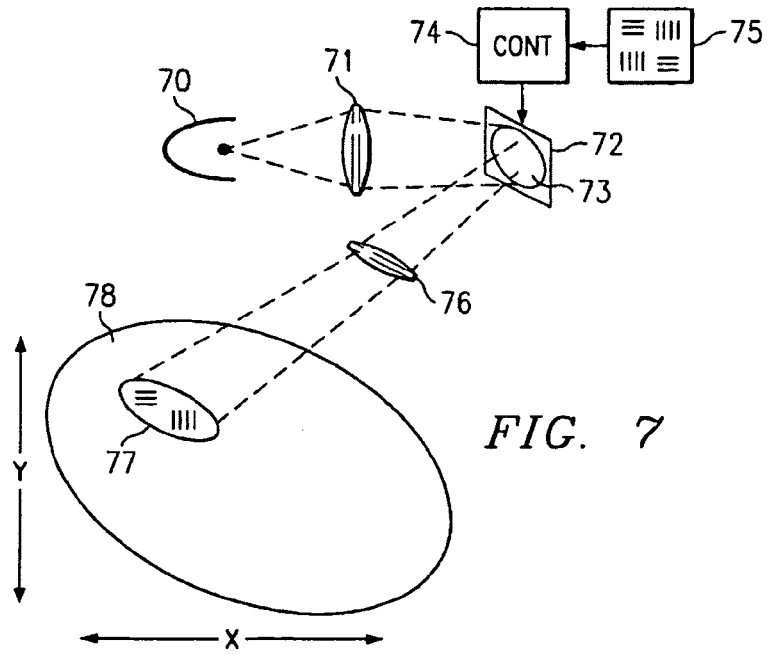
FIG. 7 is a block diagram of a UV photolithograpy system that uses a DMD SLM, which has been protected by the metal-halide films of this invention, to modulate and project the UV light to expose a pattern on a semiconductor wafer.

The coating process of the present invention is needed in any application where UV illumination is used with a MEMS device. Examples of such applications include photolithography and photo-finishing processes. For example, FIG. 7 is a block diagram of a UV photolithograpy system that uses a DMD SLM (MEMS device) to modulate and project a UV light pattern on to the photosensitive surface of a semiconductor wafer. The surfaces of the MEMS device and/or the device package's borosilicate glass window are protected against volatile chemical reactions by means of a metal-halide film, as disclosed in the present invention, which is applied to the surfaces.

The system is comprised of a UV light source 70 that emits light along a first light path. A condensing lens 71 is placed in the light path to size the beam of UV illumination to that of a MEMS SLM device 72. Light from this lens 71 is directed on to the surface 73 of the SLM 72, where it is modulated and projected along a second light path, through a projection lens 76 and on to the photosensitive surface of a semiconductor wafer 78 for the purposes of exposing the wafer with the pattern 77 for future etching. A digital electronic controller 74 receives pattern 75 data to be exposed on the wafers surface and controls the operation of the MEMS SLM 72 so as to modulate the light according to the pattern. X and Y translation stages are used to step the wafer 78 and repeat the pattern 77 exposure across the entire surface of the wafer.

While the present invention has been described in the context of a preferred embodiment, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. A MEMS device for modulating a UV light beam, comprising:
 a MEMS structure;
 a package having a window; and
 wherein the surfaces of said MEMS structure and said package window are coated with a metal-halide coating.

2. The device of claim 1, wherein said package contains modalities of the form $U_v C_w Cl_x F_y H_z$, where U represents any element and the subscripts represent the relative amount of said elements, to support proper operation of said MEMS device.

3. The device of claim 1, wherein under exposure to optical UV flux, $h_v$, said metal-halide coating prevents compounds of the type $U_vC_wCl_xF_yH_z$ from fragmenting to form Cl*, F*, CCl*, CF*, CFCl*, HCCl*, and HCF* reactive intermediate compound radicals, as follows:

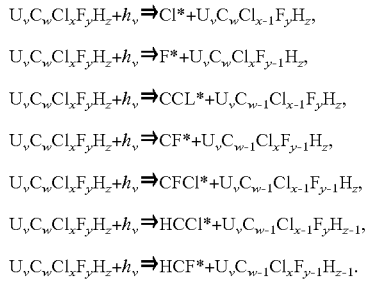

4. The device of claim 1, wherein said metal-halide coating is $M_gF_2$.

5. The process of claim 1, wherein said MEMS device is a digital micro-mirror device.

6. A UV photolithography system, comprising:
   a UV illumination source emitting a UV light beam along a first path;
   a condensing lens in said first light path sizing said light beam;
   light from said condensing lens coupled to a reflective surface of a MEMS device, said device being treated with a protective metal-halide coating to control a photochemical degradation of surfaces of said device caused by a reaction between UV optical flux and device package gases;
   an electronic controller coupled to a control input of said MEMS device for controlling a modulation of said device according to a digital photomask pattern;
   light being modulated according to said pattern reflected by the surface of said MEMS device along a second light path;
   a projection lens in said second light path receiving said modulated light; and
   light from said projection lens being projected onto and exposing a photosensitive surface.

7. The apparatus of claim 6, wherein said MEMS package contains modalities of the form $U_vC_wCl_xF_yH_z$, where U represents any element and the subscripts represent the relative amount of said elements, to support proper operation of said MEMS device.

8. The apparatus of claim 6, wherein under exposure to optical UV flux, $h_v$, said metal-halide coating prevents compounds of the type $U_vC_wCl_xF_yH_z$ from fragmenting to form C*, F*, CCl*, CF*, CFCl*, HCCl*, and HCF* reactive intermediate compound radicals, as follows:

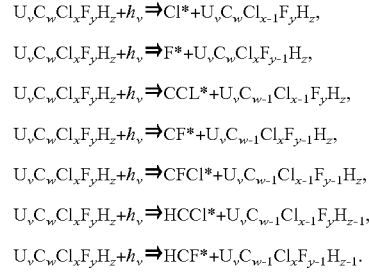

9. The apparatus of claim 6, wherein said metal-halide coating is $M_gF_2$.

10. The apparatus of claim 6, wherein said MEMS device is a digital micro-mirror device.

* * * * *